United States Patent
Chen et al.

(10) Patent No.: US 9,455,348 B2
(45) Date of Patent: Sep. 27, 2016

(54) FINFET FOR DEVICE CHARACTERIZATION

(75) Inventors: Hao-Yu Chen, Kaohsiung (TW); Chang-Yun Chang, Taipei (TW); Cheng-Chuan Huang, Jhonghe (TW); Fu-Liang Yang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 484 days.

(21) Appl. No.: 11/701,348

(22) Filed: Feb. 1, 2007

(65) Prior Publication Data

US 2008/0185650 A1   Aug. 7, 2008

(51) Int. Cl.
*H01L 29/78* (2006.01)
*H01L 29/66* (2006.01)

(52) U.S. Cl.
CPC ....... *H01L 29/785* (2013.01); *H01L 29/66795* (2013.01)

(58) Field of Classification Search
USPC ............................. 257/348, E21.409, E29.273
See application file for complete search history.

(56) References Cited

U.S. PATENT DOCUMENTS

| | | | |
|---|---|---|---|
| 6,015,993 A * | 1/2000 | Voldman et al. | 257/355 |
| 6,372,559 B1 | 4/2002 | Crowder et al. | 438/157 |
| 6,406,962 B1 | 6/2002 | Agnello et al. | 438/268 |
| 6,413,802 B1 | 7/2002 | Hu et al. | 438/151 |
| 6,706,571 B1 | 3/2004 | Yu | |
| 6,858,478 B2 | 2/2005 | Chau | |
| 7,056,781 B2 | 6/2006 | Yoon | |
| 7,190,050 B2 | 3/2007 | King | |
| 7,247,887 B2 | 7/2007 | King | |
| 7,265,008 B2 | 9/2007 | King | |
| 7,358,121 B2 * | 4/2008 | Chau | B82Y 10/00 257/E29.137 |
| 7,508,031 B2 | 3/2009 | Liu | |
| 7,528,465 B2 | 5/2009 | King | |
| 7,605,449 B2 | 10/2009 | Liu | |
| 2004/0084674 A1 * | 5/2004 | Mathew et al. | 257/66 |
| 2004/0099903 A1 * | 5/2004 | Yeo et al. | 257/317 |
| 2006/0084211 A1 * | 4/2006 | Yang et al. | 438/197 |
| 2006/0273372 A1 * | 12/2006 | Voldman et al. | 257/308 |

OTHER PUBLICATIONS

U.S. Appl. No. 12/410,428, filed Mar. 24, 2009, Tsu-Jae King.
U.S. Appl. No. 11/755,715, filed May 30, 2007, Victor Moroz.
U.S. Appl. No. 12/178,496, filed Jul. 23, 2008, Tsu-Jae King.
U.S. Appl. No. 11/668,827, filed Jan. 30, 2007, Tsu-Jae King Liu.
U.S. Appl. No. 11/668,815, filed Jan. 30, 2007, Tsu-Jae King Liu.

* cited by examiner

*Primary Examiner* — Tucker J Wright
(74) *Attorney, Agent, or Firm* — Haynes and Boone, LLP

(57) ABSTRACT

A method and system is disclosed for providing access to the body of a FinFET device. In one embodiment, a FinFET device for characterization comprises an active fin comprising a source fin, a depletion fin, and a drain fin; a side fin extending from the depletion fin and coupled to a body contact for providing access for device characterization; and a gate electrode formed over the depletion fin and separated therefrom by a predetermined dielectric layer, wherein the gate electrode and the dielectric layer thereunder have a predetermined configuration to assure the source and drain fins are not shorted.

20 Claims, 10 Drawing Sheets

FINFET FOR DEVICE CHARACTERIZATION

BACKGROUND

The present invention relates generally to semiconductor devices, and more particularly to a system of structures for better enabling device characterization for FinFET devices.

Before the advances of FinFET technologies, semiconductor devices were arranged whereby their active areas were laid out on a horizontal plane, side by side each other. As technology continues to advance and the necessity to pack more semiconductor devices on a single chip become more pressing, the need to devise a new arrangement is of paramount importance.

FinFET technologies provide a viable alternative to pack hundreds of millions of semiconductor devices within a single chip while still reducing the area of the chip. In FinFET technologies, because the active areas of these semiconductor devices are placed vertically, the total required planar area is reduced.

FinFET also offers various design characteristics that can reduce leakage. As one example, active areas are built on an insulator, which minimizes leakage, instead of a semiconductor substrate typical in older technologies. As another example, because FinFET technologies allow the channel to wrap around the body between the source and the drain, a double gate having gates on each vertical side of the depletion region is possible whereby the double gated device provides a lower channel leakage current than a single gated device. As a further example, leakage in a fin of the FinFET is reduced simply because of the reduction of the volume of the body.

However, current FinFET technologies do not provide an easy mechanism to characterize devices in designs and in production, because there is no easy way to make contact to all four terminals (the source, the drain, the gate, and the body) of a semiconductor device. When the source, the drain, and the gate are available, the body is unavailable because there is no way of reaching the body when the device is on top of an insulator. Without electrical information from all four terminals, adequate information regarding the device cannot be fully retrieved, thus limiting the viability and effectiveness when deploying FinFET technologies.

Desirable in the art of semiconductor designs are additional designs for better enabling device characterization in a FinFET device environment.

SUMMARY

In view of the foregoing, the following provides a transistor system for better enabling device characterization in a FinFET environment.

In one embodiment, a FinFET device for characterization comprises an active fin comprising a source fin, a depletion fin, and a drain fin; a side fin extending from the depletion fin and coupled to a body contact for providing access for device characterization; and a gate electrode formed over the depletion fin and separated therefrom by a predetermined dielectric layer, wherein the gate electrode and the dielectric layer thereunder have a predetermined configuration to assure the source and drain fins are not shorted.

In anther embodiment, a FinFET device specially designed for characterization is disclosed. It comprises an active fin comprising a source fin, a body fin, and a drain fin; a first lightly-doped drain (LDD) region converting at least a portion of either the source or drain fin to be coupled with the body fin; a body contact heavily doped with a same type of material as the LDD region and coupled with the LDD region for providing access for device characterization; and a gate electrode formed over the body fin and separated therefrom by a predetermined dielectric layer.

The construction and method of operation of the invention, however, together with additional objects and advantages thereof will be best understood from the following description of specific embodiments when read in connection with the accompanying drawings.

DESCRIPTION

The present invention provides a detailed description for the construction of a body contact for device characterization in a FinFET device environment.

Figure 1:
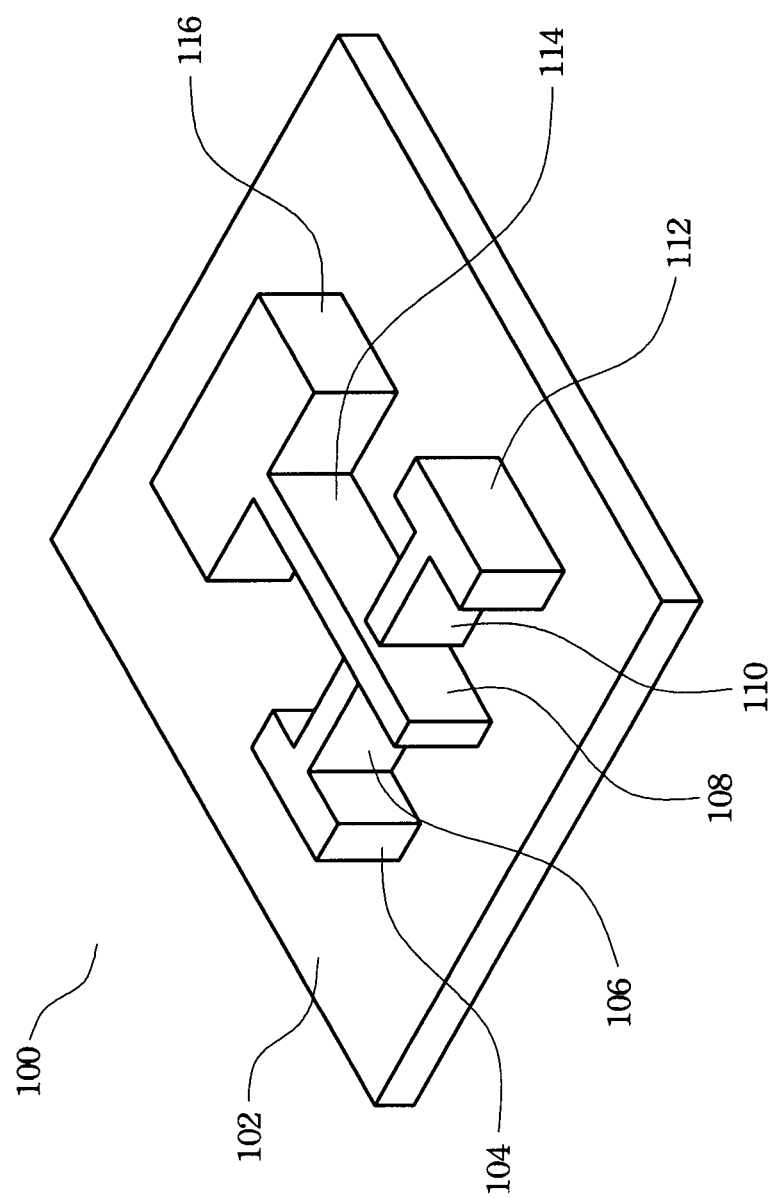
FIG. 1 presents an isometric view of a conventional FinFET metal-oxide-semiconductor field-effect-transistor.

In FIG. 1, an isometric view 100 illustrates a conventional FinFET metal-oxide-semiconductor field-effect-transistor (MOSFET). This type of transistor saves space by turning the active areas and gate electrodes into vertical planes instead of the traditional horizontal planes. The transistor is built on a horizontal plane of buried oxide BOX 102. The active area of the transistor includes a source contact area 104, a vertical source fin 106, a body fin 108 (also a vertical well), a vertical drain fin 110, and a drain contact area 112. The body fin 108 is surrounded on both sides as well as the top by a vertical gate electrode fin 114, which is further connected to a gate contact area 116. In FIG. 1, the hard mask that is used to protect the active area during etching is removed prior to the formation of the gate dielectric layer. Therefore, the vertical gate electrode fin 114 functions as a gate electrode on all three sides of the body fin 108 that it surrounds. If the hard mask had not been removed, the top surface of the body fin 108 would not have been susceptible to the influence of the vertical gate electrode fin 114 and only the two vertical side surfaces of the body fin 108 would have acted as MOS channels. However, in FIG. 1, all three surfaces—the top and the two sides of the body fin 108—function as MOS channels that are controlled by the vertical gate electrode fin 114.

The mask may be composed of a photoresist layer or a hard mask material such as silicon oxide $SiO_2$, silicon nitride $Si_3N_4$, or a combination thereof. In this preferred embodiment, the material is $SiO_2$.

A feature of one embodiment of the present invention is a fin smoothing step that is introduced before the formation of the gate dielectric. A first option for smoothing the surfaces of the active fin, which includes the vertical source fin 106, the body fin 108, and the vertical drain fin 110, is the formation and then removed, by etching, of a sacrificial oxide. A second option for smoothing the surfaces of the active fin is by, for instance, a high temperature anneal at 1,000° C. in a hydrogen ambient. If the photoresist is used as the masking material, it must be removed before any high temperature treatment. Smoothing the surfaces of the fin that will become gate areas on the body fin 108 contributes to improved carrier mobility, and therefore improved FinFET performance.

If a hard mask is removed before a surface smoothing step, then the top surface of the smoothed fin is rounded by the smoothing step. If a hard mask is not removed before a surface smoothing step, then the top surface of the smoothed fin will retain a square-cornered shape.

Figure 2:
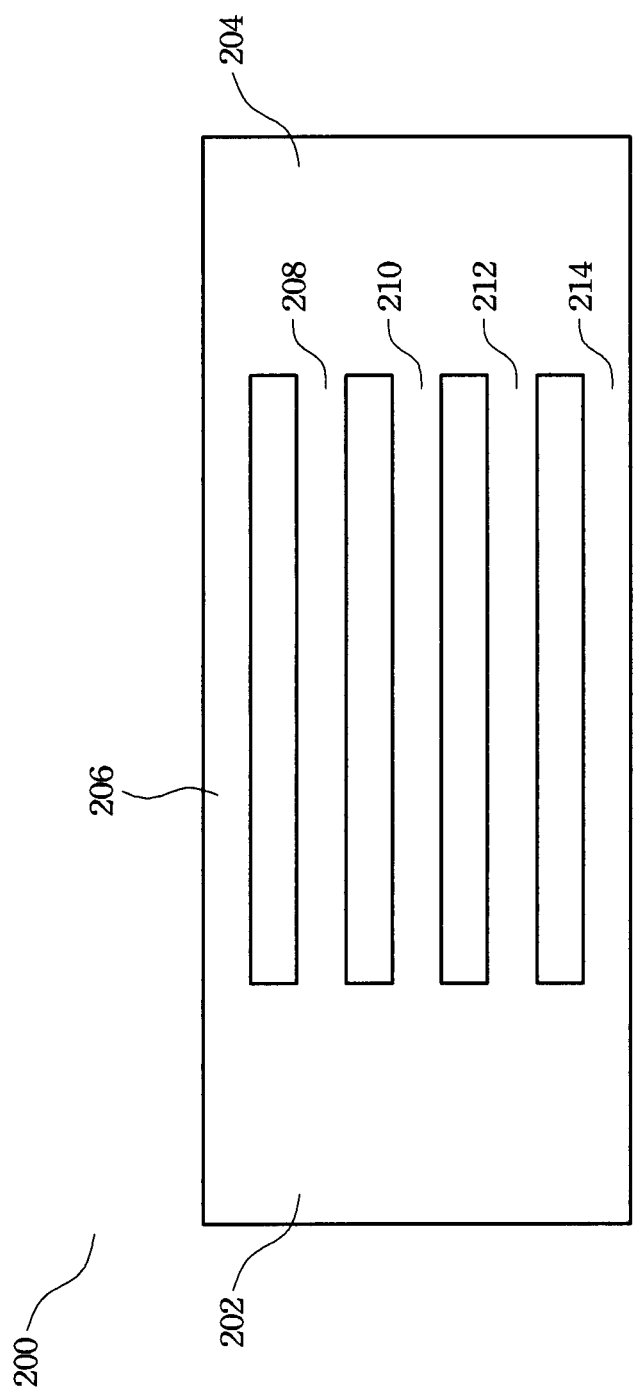
FIG. 2 presents a chip layout of the active area of a FinFET.

A first embodiment of the present invention is the construction of devices that are useful only for the evaluation of device parameters. In FIG. 2, a chip layout 200 illustrates the active area of a FinFET that has the same basic layout as that in FIG. 1, but with five active fins instead of just one. On a horizontal plane of BOX, not shown, a source contact area 202 is connected to a drain contact area 204 by five vertical active fins 206, 208, 210, 212, and 214. After etching has defined this area, the surface smoothing step described above may be performed. Then, a well implant is performed to set junction breakdowns and threshold voltages.

Figure 3:
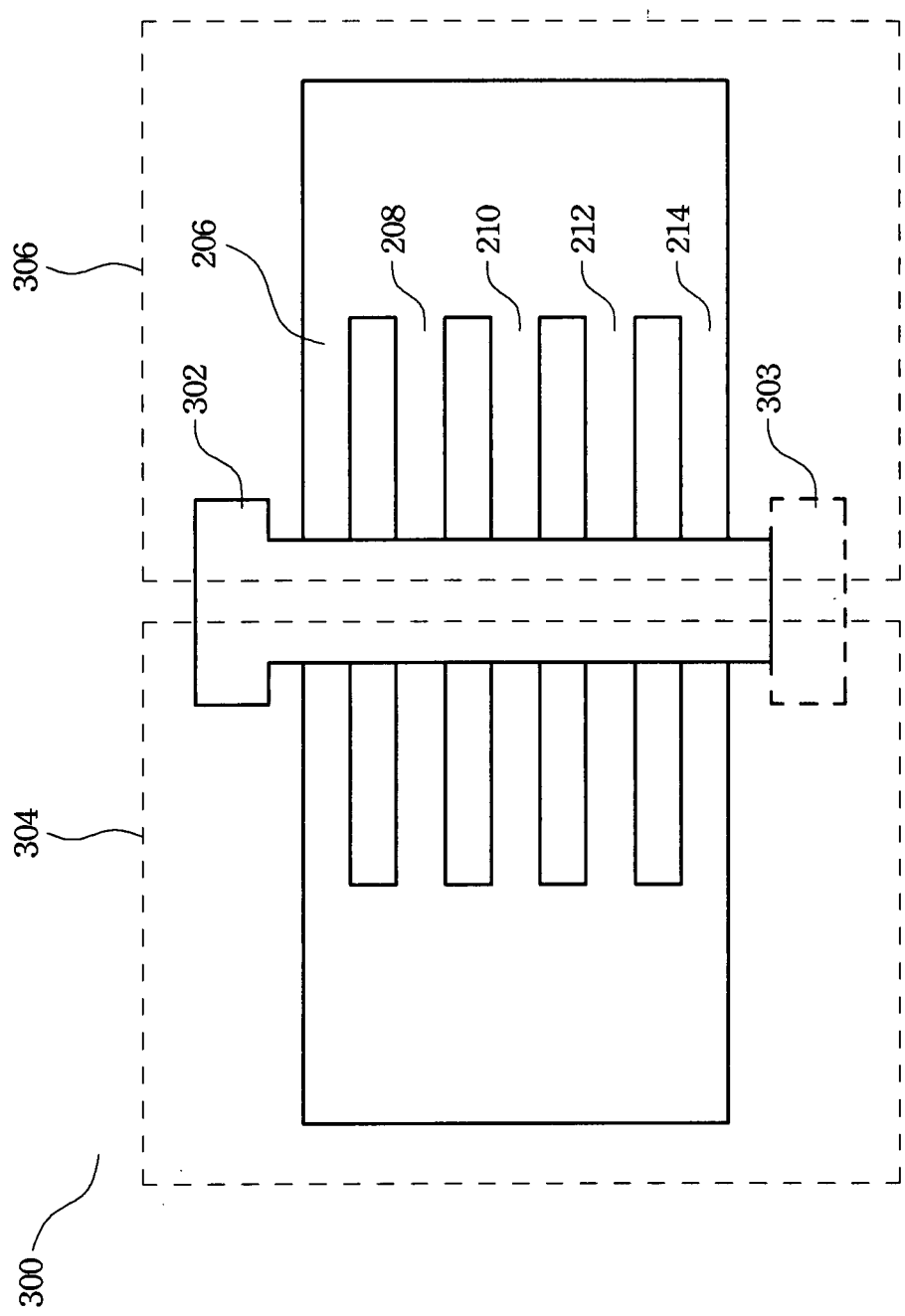
FIG. 3 presents a chip layout of a P-well device.

In FIG. 3, a chip layout 300 illustrates a P-well device. Because it does not have a second N+ region, it is not a normal N-channel MOS transistor but merely a test device. Then, a gate dielectric is formed. The gate dielectric may be formed by thermal oxidation, chemical vapor deposition (CVD), sputtering, or other methods. Depending on the technique used, the thickness on the top surface of the active fins may be different from that on the sidewalls. In some applications, the dielectric thickness may be less than 20 Å. The gate dielectric may be composed of a conventional material such as $SiO_2$ or silicon oxynitride with a thickness ranging from 3 to 100 Å, preferably, 10 Å or less. The gate dielectric may also be composed of high permittivity (high κ) materials such as aluminum oxide $Al_2O_3$, hafnium oxide $HfO_2$, or zirconium oxide $ZrO_2$ with an equivalent oxide thickness of 3 to 100 Å.

Next, the gate electrode material is deposited. The gate electrode material perfectly fills the slots between the active fins 206, 208, 210 212, and 214. The gate electrode material may be polycrystalline silicon, polycrystalline silicon-germanium Poly SiGe, a refractory metal such as molybdenum or tungsten, compounds such as titanium nitride, or other electrically conducting materials. In FIG. 3, a gate dielectric mask pattern 302 is defined and, in exposed areas, the underlying gate dielectric material is etched away, leaving the gate electrode. The gate electrode etch stops on the gate dielectric. Then, the gate electrode is isolated from the transistor structure by the gate dielectric. The gate masking material is then removed. It is contemplated that an optional second gate dielectric mask pattern 303 may be defined.

The P-type lightly-doped drain (LDD) is implanted through a mask window 304 to make good electrical contact to the P-well. The N-type LDD is implanted through the mask window 306 to form the normal drain diode. Now, since electrical contact to the MOS body, as the P-well, is available for electrical testing techniques such as C-V testing, the structures and parameters typical of MOS devices in neighboring integrated circuits can be evaluated.

Figure 4:
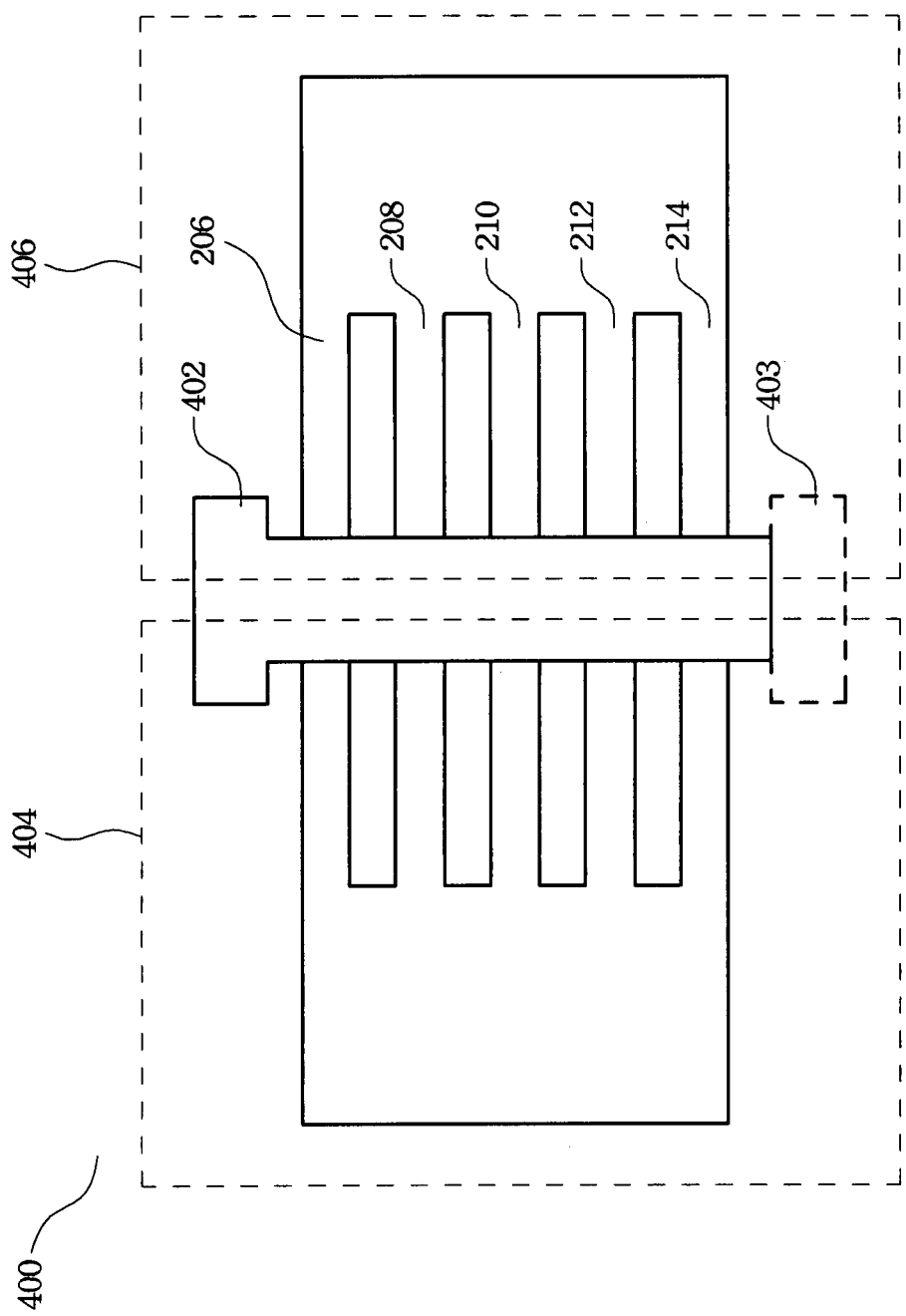
FIG. 4 presents a chip layout of a N-well device.

In FIG. 4, a chip layout 400 illustrates an N-well device that, similar to the P-well device in the chip layout 300, is a test device. The P-well device is first formed by first forming the active fins 206, 208, 210, 212, and 214. A gate dielectric and a gate electrode 402 are formed, as in the P-well device in FIG. 3. It is further contemplated that an optional second gate electrode 403 may be formed to form a double gate device.

The N-type LDD is implanted through a mask window 404 to make good electrical contact to the N-well. The P-type LDD is implanted through a mask window 406 to form the normal drain diode. Now, since electrical contact to the MOS body is available for electrical testing techniques such as C-V testing, the structures and parameters typical of MOS devices in neighboring integrated circuits can be evaluated.

Figure 5:
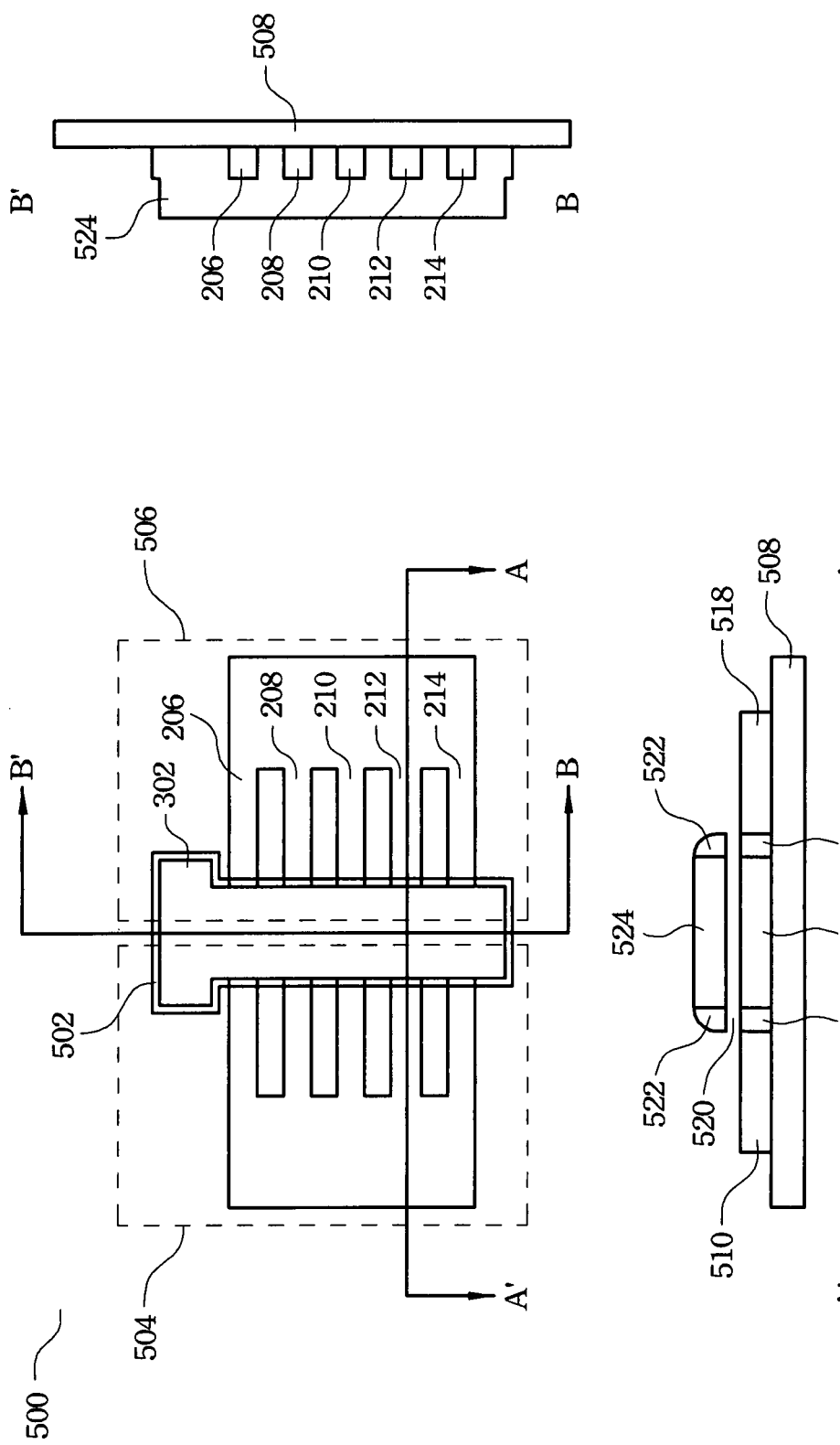
FIG. 5 presents a chip layout showing further processing done on the P-well device of FIG. 3.

In FIG. 5, a chip layout 500 illustrates further processing of the P-well device of FIG. 3. A spacer 502 is constructed around the sidewalls of the gate electrode 302 by standard techniques. For the spacer, dielectric material is deposited and vertically etched. The dielectric spacer may be composed of $SiO_2$ or $Si_3N_4$ or a combination thereof.

The contact is heavily doped with P-type through a mask window 504 for good electrical contact and low electrical resistance. The spacer masks the dopant to complete the LDD structure. The N-contact is heavily doped with N-type through a mask window 506 for good electrical contact and low electrical resistance. The spacer masks the dopant to complete the LDD structure. The dopants are delivered by implantation, gas or solid source diffusion, or other common techniques.

Vertical cross section A-A' lies along the length of a vertical active fin, which lies on a BOX 508. The active fin includes a P+ contact area 510, a vertical P-LDD fin 512, a body fin 514 (also known as a vertical P-well), a vertical N-LDD 516, and an N+ contact area 518. The LDD areas and the well area are covered by a gate dielectric 520. Spacers 522 cover the P-LDD 512 and N-LDD 516. A gate electrode 524 covers the body fin 514.

Note that the PN junction created between the body fin 514 and the N+ contact area 518 increases the breakdown voltage tolerance of the device due to the lower drain side field, thus also allowing the device to be used as an ESD protection diode.

Vertical cross section B-B' lies along the length of the gate electrode 302, and across the fins 206, 208, 210, 212, and 214. A gate electrode 524 crosses all the fins and perfectly fills the slots between them.

Figure 6:
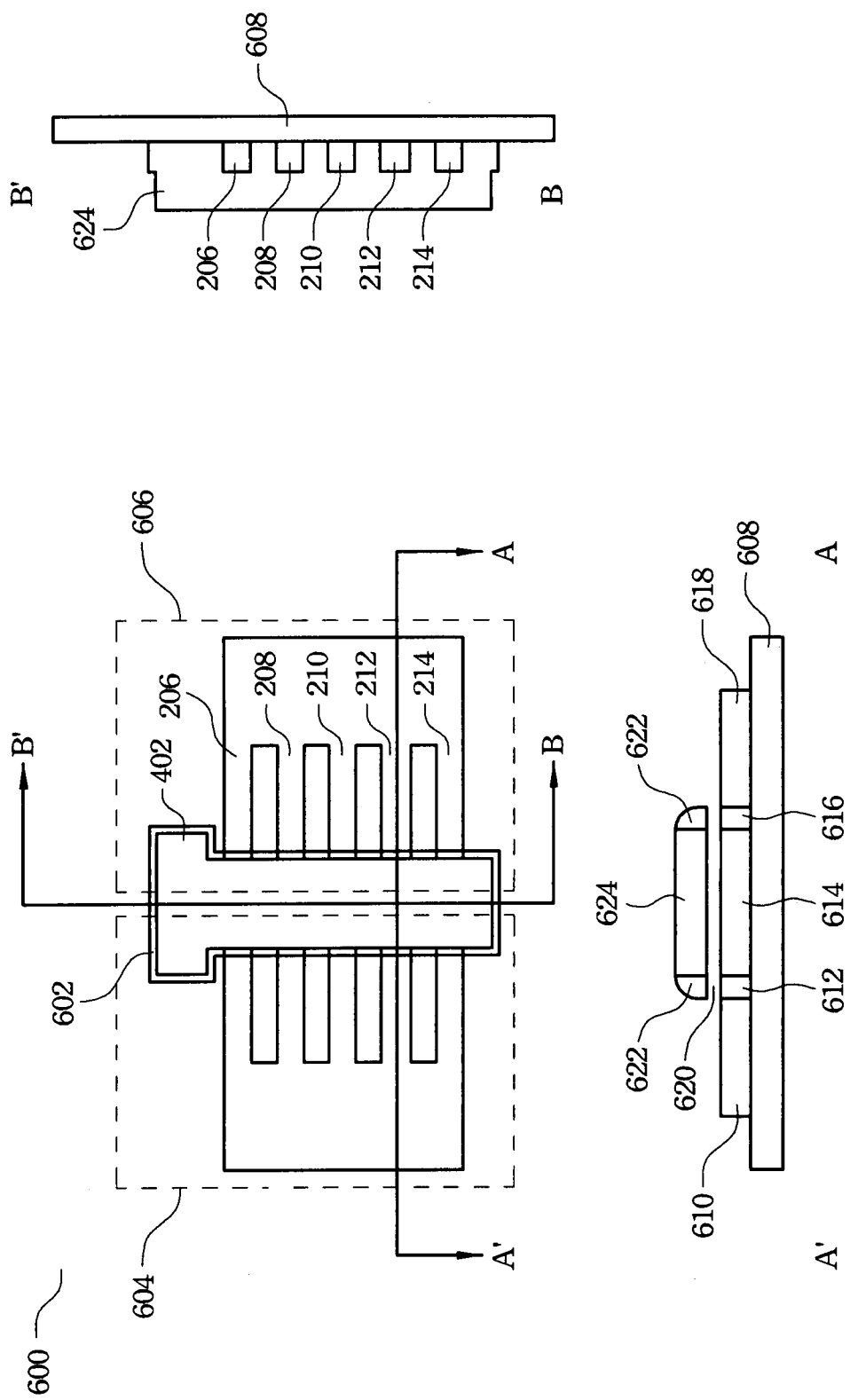
FIG. 6 presents a chip layout showing further processing done on the N-well device of FIG. 4.

In FIG. 6, a chip layout 600 illustrates further processing of the N-well device of FIG. 4. A spacer 602 is constructed around the sidewalls of the gate electrode 402 by standard techniques. For the spacer, dielectric material is deposited and vertically etched. The dielectric spacer may be composed of $SiO_2$ or $Si_3N_4$ or a combination thereof.

The contact is heavily doped with N-type through a mask window 604 for good electrical contact and low electrical resistance. The spacer masks the dopant to complete the LDD structure. The P-contact is heavily doped with P-type through a mask window 606 for good electrical contact and low electrical resistance. The spacer masks the dopant to complete the LDD structure. The dopants are delivered by implantation, gas or solid source diffusion, or other common techniques.

Vertical cross section A-A' lies along the length of a vertical active fin, which lies on a BOX 608. The active fin includes an N+ contact area 610, a vertical N-LDD fin 612, a body fin 614, a vertical P-LDD 616, and a P+ contact area 618. The LDD areas and well area are covered by a gate dielectric 620. Spacers 622 cover the N-LDD 612 and the P-LDD 616. The gate electrode 624 covers the body fin 614. The body fin 614, which is of N-type, and the P+ contact area 618, which is of P-type, together provide a PN junction that increases the breakdown voltage tolerance of the device due to the lower drain side field, thus also allowing the device to be used as an ESD protection diode. In the preferred embodiment, break down voltage tolerance is about 3V for devices using the FinFET technology described herein, as opposed to about 2.25V for devices using planar silicon-on-insulator fabrication methods.

Vertical cross section B-B' lies along the length of the gate electrode 402, and across the fins 206, 208, 210, 212, and 214. The gate electrode 624 crosses all the fins and perfectly fills the slots between them.

A second embodiment of the present invention is the construction of a device that is a real FinFET and yet provides contact to the body. This new opportunity to gain access to all four terminals of a FinFET allows realistic characterization of parameters of devices that are typical of those in the larger integrated circuits. Some examples of device parameters that can be easily extracted are: junction capacitance, overlay capacitance, gate current, and substrate current. With the extracted parameters such as these examples, an accurate device model can be realized.

Figure 7:
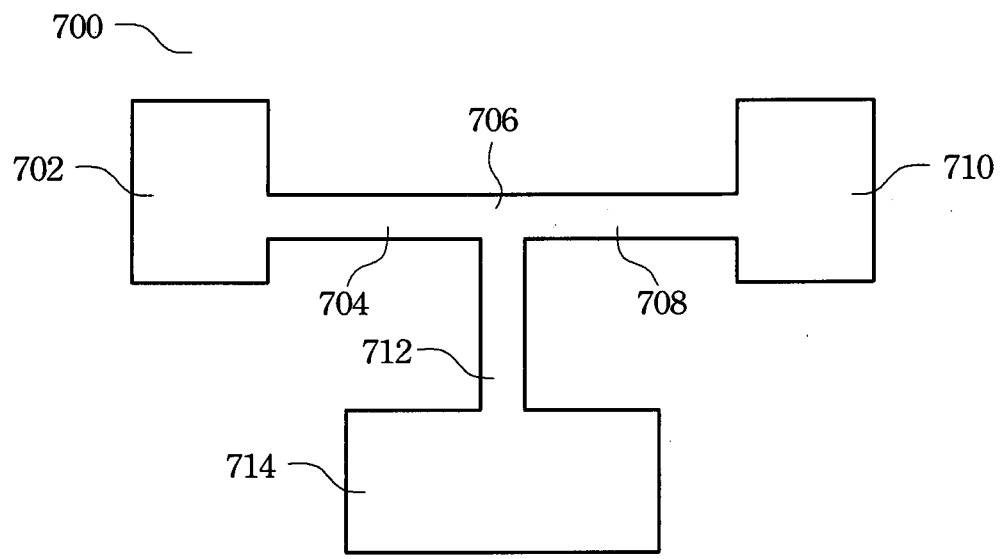
FIG. 7 presents a chip layout in accordance with one embodiment of the present invention.

In FIG. 7, a chip layout 700 illustrates a FinFET with a body contact. This is an N-channel MOSFET within a P-well. As understood by those skilled in the art, the following description also applies to P-channel MOSFET within an N-well. The active fin includes an N-source contact area 702, a vertical N-source fin 704, a vertical depletion fin or P-body fin 706, a vertical N-drain fin 708, and an N-drain contact area 710. The vertical P-body fin 706, which is the depletion region of the transistor's junction, is not yet apparent at this stage, but according to the present invention, there is a side fin, perpendicular to the active fin, and continuous with the active fin. This side fin is a P-body fin 712 that connects to a P-body contact area 714. The combination of the body contact area 714 and the P-body fin 712 is continuous with the active fin on one side.

Figure 8:
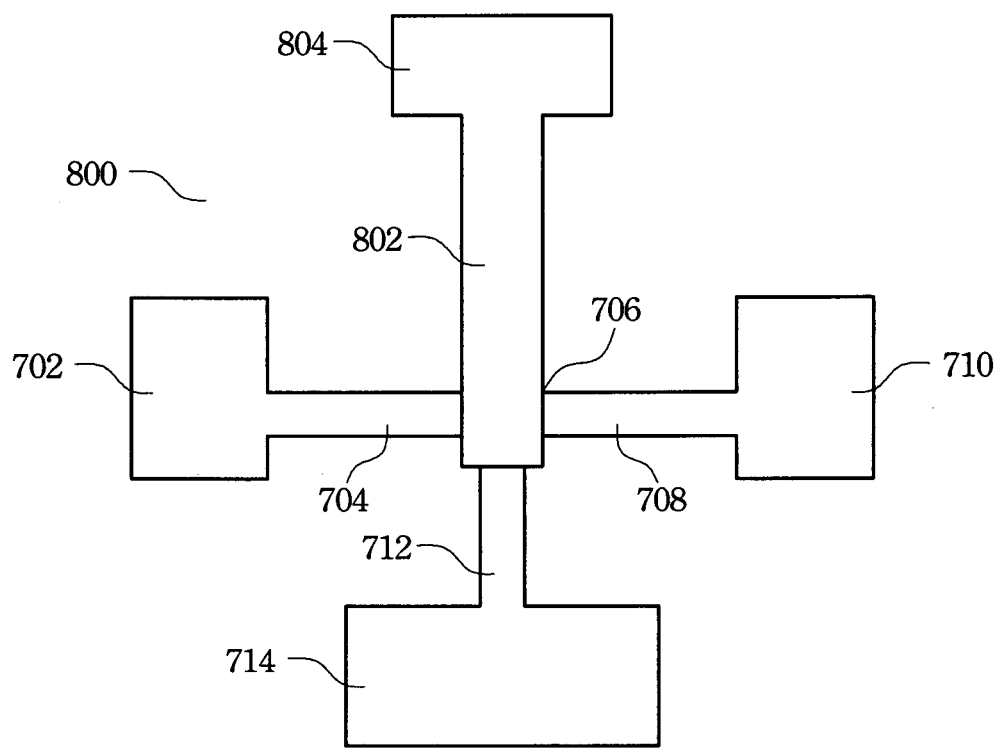
FIG. 8 presents a chip layout with a gate electrode in accordance with one embodiment of the present invention.

In FIG. 8, a chip layout 800 illustrates a four-terminal device with a body contact and a gate electrode comprising a vertical gate electrode fin 802 that is further connected to a gate contact area 804. The vertical gate electrode fin 802 extends across the vertical active fin to also overlap a short portion of the vertical P-body fin 712. This ensures that, even in the case of slight misalignment of subsequent N+ and P+ implant masks, not shown, the vertical gate electrode fin 802 will still completely cover the P-well or body region. If the vertical gate electrode fin 802 was too short, then N+ implant and/or N-LDD implant would short the source and drain. If the vertical P-body fin 712 were too wide, then misalignment could cause the vertical P-body fin 712 to be shorted to either the source or the drain.

Figure 9:
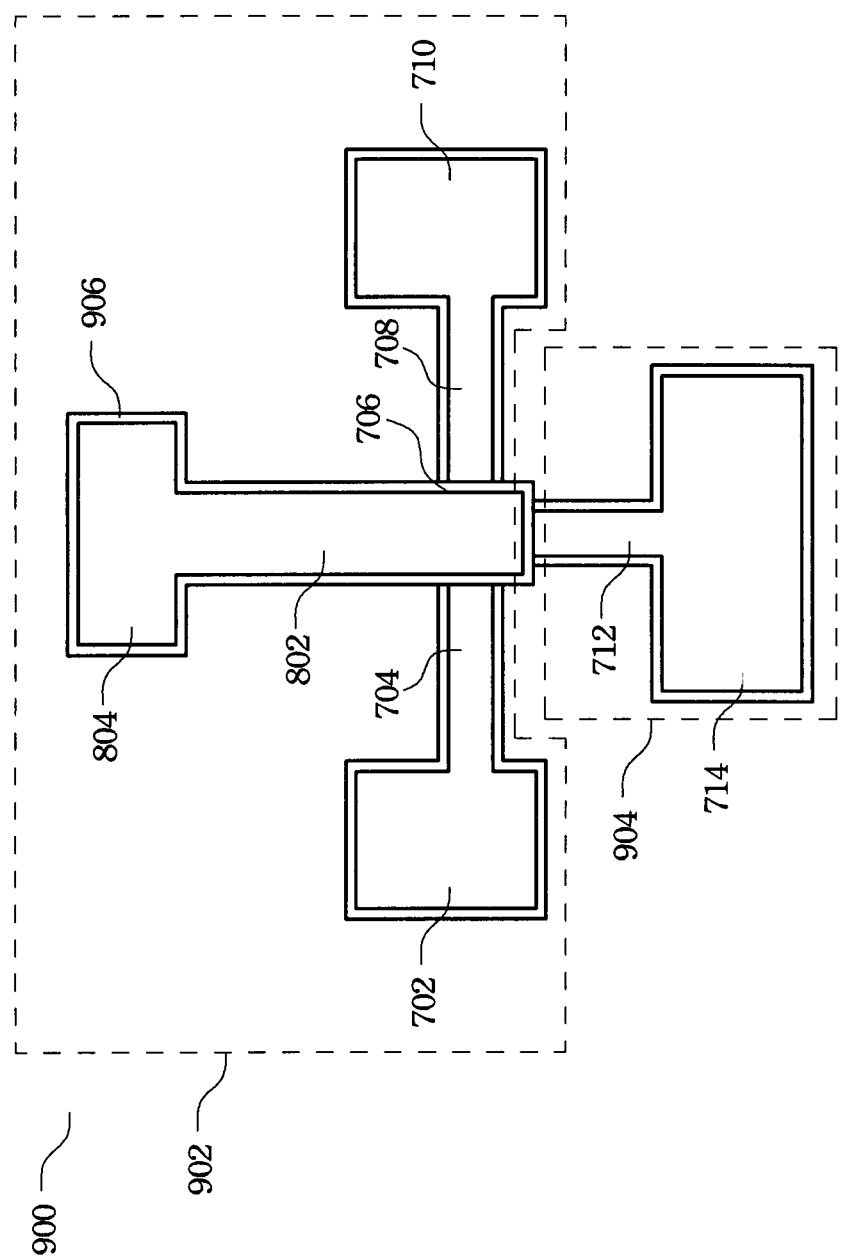
FIG. 9 presents a chip layout with two implant masks in accordance with one embodiment of the present invention.

In FIG. 9, a chip layout 900 illustrates the four-terminal device in FIG. 8 with two implant masks in accordance with one embodiment of the present invention. An N-type LDD is implanted through a mask window 902 into the the area 702 and the fin 704, the fin 708 and the area 710, and the fin 802 and the area 804. A P-type LDD is implanted through a mask window 904 into the P-body fin 712 and the body contact area 714. Then, spacers 906 are produced by standard techniques. Then, N+ is implanted through the mask window 902 into the area 702 and the fin 704, the fin 708 and the area 710, and the fin 802 and the area 804. P+ is implanted through the mask window 904 into the P-body fin 712 and the body contact area 714. The implants are annealed.

Figure 10:
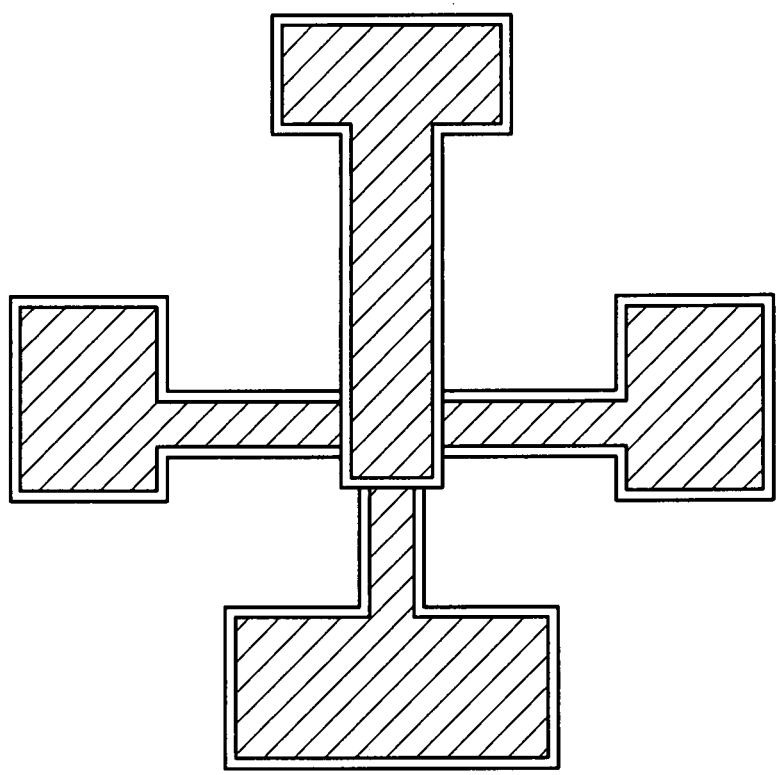
FIG. 10 presents a chip layout after a self-aligned silicide formation in accordance with one embodiment of the present invention.

In FIG. 10, a chip layout 1000 illustrates the four-terminal devices in FIG. 9 after a self-aligned silicide formation (salicide) in accordance with one embodiment of the present invention. Appropriate metal is alloyed into the silicon surfaces of the areas and fins pertaining to the source, the drain, the gate, and the body. These surfaces are separated by the spacers.

Figure 11:
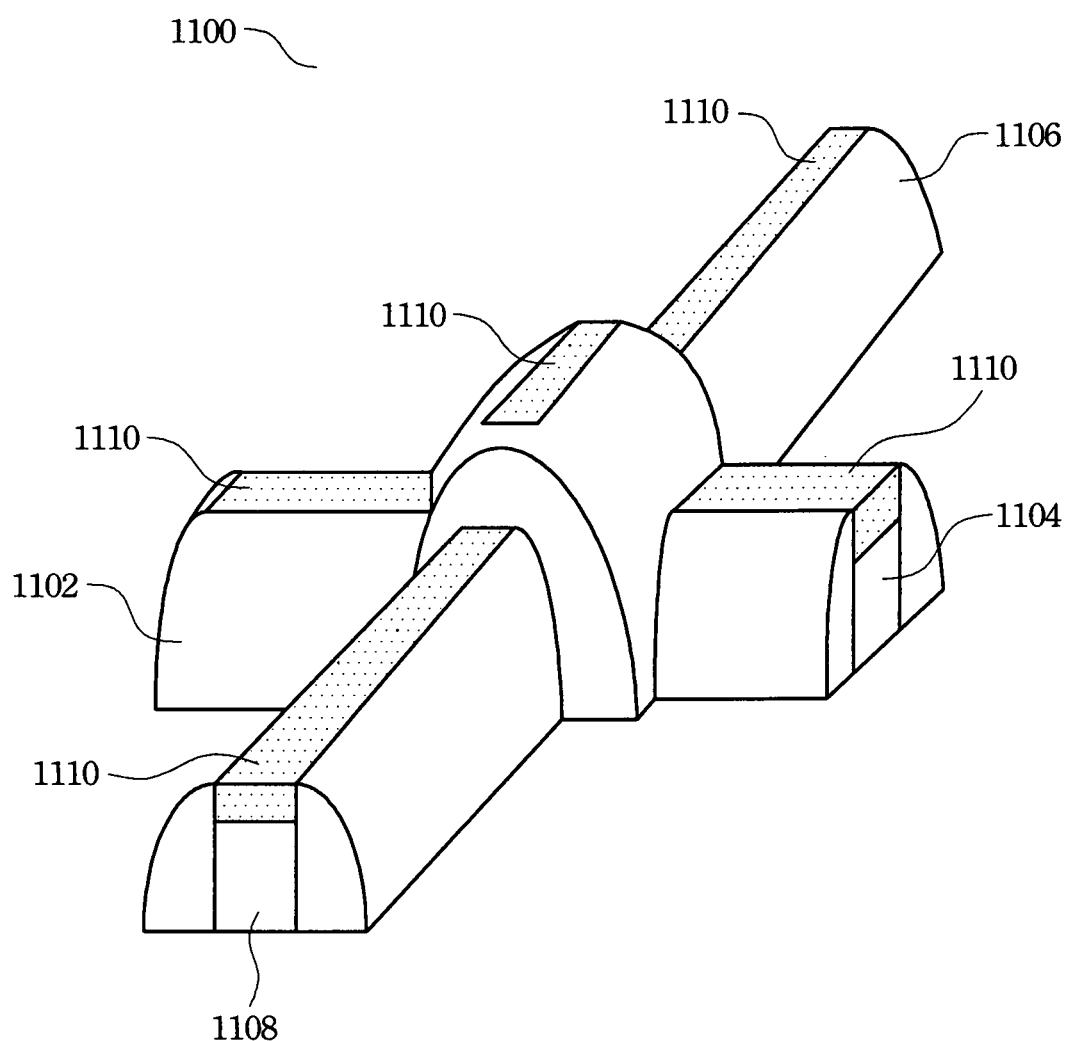
FIG. 11 presents an isometric view of the four-terminal device in FIG. 9 in accordance with one embodiment of the present invention.

In FIG. 11, an isometric view 1100 illustrates the four-terminal device in FIG. 9 with the spacers formed and the exposed silicon surfaces silicided. The relationships are shown among a source 1102, a drain 1104, a gate 1106, and a body 1108. The exposed top surface of the silicon in each of the four areas is silicide 1110. As shown, the four silicide 1110 areas are separated.

The body contact technique in this FinFET can be used in I/O circuits. It can also be used in germanium on insulator or gallium arsenide on insulator (GOI) devices for the purpose of C-V measurements. The number of fins can be increased or a number of FinFETs can be connected to increase the effective dimension to increase the measurement accuracy.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A FinFET device for characterization, comprising:
   a dielectric material layer;
   a plurality of vertical active fins disposed directly over the dielectric material layer, each vertical active fin including a P+ contact area, a vertical P-type LDD fin, a vertical P-type body fin, a vertical N-type LDD fin, and an N+ contact area, wherein the vertical P-type LDD fin is formed between the P+ contact area and the vertical P-type body fin, and the vertical N-type LDD fin is formed between the vertical P-type body fin and the N+ contact area to provide a PN junction, wherein the vertical P-type LDD fin includes a p-type LDD doped feature and wherein the vertical N-type LDD fin includes an n-type LDD doped feature;
   a gate electrode formed over the plurality of vertical active fins and separated therefrom by a gate dielectric layer,
      wherein the gate electrode has a first portion disposed over the plurality of vertical active fins and having a first width in a first direction and a second portion having a second width in the first direction that is greater than the first width,
wherein the second portion of the gate electrode includes a first vertical sidewall opposite the plurality of vertical active fins and extending from the dielectric material layer to a first height, and the second portion includes a second vertical sidewall opposite the plurality of vertical active fins and extending from the first height to a topmost surface of the gate electrode,
wherein the first vertical sidewall and the second vertical sidewall are offset such that a surface extends between the first vertical sidewall and the second vertical sidewall, and
wherein at least one of the p-type LDD doped feature and the n-type LDD doped feature extends from the gate dielectric layer to the dielectric material layer; and
a spacer layer including a first portion disposed directly over the vertical P-type LDD fin and a second portion disposed directly over the vertical N-type LDD fin, wherein the first and the second portions are formed on sidewalls of the gate electrode.

2. The device of claim 1, wherein the gate dielectric layer is a silicon oxide.

3. The device of claim 1, wherein the spacer layer is composed of dielectric material.

4. The device of claim 3, wherein the spacer layer is composed of SiO2 or Si3N4 or a combination thereof.

5. The device of claim 1, wherein the PN junction is configured to increase a breakdown voltage tolerance of the FinFET device, thereby allowing the device to be used as an ESD protection diode.

6. The device of claim 1, wherein the dielectric material layer is a buried oxide layer.

7. A FinFET device for characterization, comprising:
a dielectric material layer;
a plurality of vertical active fins disposed directly over the dielectric material layer, each vertical active fin including a N+ contact area, a vertical N-type LDD fin, a vertical N-type body fin, a vertical P-type LDD fin, and a P+ contact area, wherein the vertical N-type LDD fin is formed between the N+ contact area and the vertical N-type body fin, and the vertical P-type LDD fin is formed between the vertical N-type body fin and the P+ contact area to provide a PN junction, wherein the vertical P-type LDD fin includes a p-type LDD doped feature and wherein the vertical N-type LDD fin includes an n-type LDD doped feature,
wherein the respective N+ contact areas of the plurality of vertical active fins define a first shared contact extending from a first surface to a second surface that is substantially parallel to the first surface and the respective P+ contact areas of the plurality of vertical active fins define a second shared contact extending from a third surface to a fourth surface that is substantially parallel to the third surface, and
wherein a first fin of the plurality of vertical active fins has a side surface that is coplanar with and extends from the first surface of the first shared contact to the third surface of the second shared contact and a second fin of the plurality of vertical active fins has a side surface that is coplanar with and extends from the second surface of the first shared contact to the fourth surface of the second shared contact;
a gate electrode formed over the plurality of vertical active fins and separated therefrom by a gate dielectric layer,
wherein the gate electrode includes a first vertical surface extending from the dielectric material layer to a first height, a second vertical surface extending from the first height to a topmost surface of the gate electrode, and a substantially horizontal surface disposed between the first vertical surface and the second vertical surface, and
wherein at least one of the p-type LDD doped feature and the n-type LDD doped feature extends from the gate dielectric layer to the dielectric material layer; and
a spacer layer including a first portion disposed directly over the vertical N-type LDD fin and a second portion disposed directly over the vertical P-type LDD fin, wherein the first and the second portions are formed on sidewalls of the gate electrode.

8. The device of claim 7, wherein the gate dielectric layer is a silicon oxide.

9. The device of claim 7, wherein the spacer layer is composed of dielectric material.

10. The device of claim 9, wherein the spacer layer is composed of SiO2 or Si3N4 or a combination thereof.

11. The device of claim 7, wherein the PN junction is configured to increase a breakdown voltage tolerance of the FinFET device, thereby allowing the device to be used as an ESD protection diode.

12. The device of claim 7, wherein the dielectric material layer is a buried oxide layer.

13. A device comprising:
a buried oxide material layer;
a fin structure disposed over the buried oxide material layer, wherein the fin structure includes:
a first heavily doped feature having a first dopant type,
a first lightly doped feature having the first dopant type,
a second heavily doped feature having a second dopant type, wherein the second dopant type is opposite the first dopant type,
a second lightly doped feature having the second dopant type, wherein at least one of the first and second lightly doped features extends to the buried oxide layer, and
a doped well feature having the first dopant type, the doped well feature extending from the first lightly doped feature to the second lightly doped feature;
a gate dielectric layer disposed over the fin structure; and
a gate electrode disposed over the gate dielectric layer, wherein the gate electrode has a first portion disposed over the fin structure that has a first width and a second portion that has a second width that is greater than the first width,
wherein the second portion of the gate electrode includes:
a first sidewall portion opposite the fin structure and extending from the buried oxide material layer;
a second sidewall portion opposite the fin structure, disposed above the first sidewall portion, and offset therefrom; and
a third sidewall portion extending between the first sidewall portion and the second sidewall portion.

14. The device of claim 13, further comprising a sidewall spacer disposed along a sidewall of the gate electrode.

15. The device of claim 14, wherein the sidewall spacer has an inner edge facing the fin structure and an outer edge facing away from the fin structure, and wherein the first lightly doped feature has an inner edge facing the doped well feature and an opposing outer edge, wherein the inner edge of the first lightly doped feature is aligned with the inner edge of the sidewall spacer, and wherein the outer edge of the first lightly doped feature is aligned with the outer edge of the sidewall spacer.

16. The device of claim 14, wherein the sidewall spacer has an inner edge facing the fin structure and an outer edge facing away from the fin structure, and wherein the second lightly doped feature has an inner edge facing the doped well feature and an opposing outer edge, wherein the inner edge of the first lightly doped feature is aligned with the inner edge of the sidewall spacer, and wherein the outer edge of the second lightly doped feature is aligned with the outer edge of the sidewall spacer.

17. The device of claim 13, wherein both the first and second lightly doped features extend from the gate dielectric layer to the buried oxide layer.

18. The device of claim 13, wherein the first heavily doped feature physically contacts the first lightly doped feature, and wherein the second heavily doped feature physically contacts the second lightly doped feature.

19. The device of claim 13, wherein the first dopant type is an n-type dopant, and wherein the second dopant type is a p-type dopant.

20. The device of claim 13, wherein the first dopant type is a p-type dopant, and wherein the second dopant type is an n-type dopant.

\* \* \* \* \*